United States Patent
Yamamoto et al.

(10) Patent No.: US 8,516,892 B2
(45) Date of Patent: *Aug. 27, 2013

(54) PRESSURE SENSOR MODULE AND ELECTRONIC COMPONENT

(75) Inventors: Satoshi Yamamoto, Sakura (JP); Hirokazu Hashimoto, Sakura (JP)

(73) Assignee: Fujikura Ltd., Tokyo (JP)

( * ) Notice: Subject to any disclaimer, the term of this patent is extended or adjusted under 35 U.S.C. 154(b) by 40 days.

This patent is subject to a terminal disclaimer.

(21) Appl. No.: 13/281,959

(22) Filed: Oct. 26, 2011

(65) Prior Publication Data

US 2012/0036936 A1    Feb. 16, 2012

Related U.S. Application Data

(62) Division of application No. 12/427,954, filed on Apr. 22, 2009, now Pat. No. 8,122,768.

(30) Foreign Application Priority Data

Apr. 24, 2008 (JP) ................................. 2008-114262

(51) Int. Cl.
*G01L 7/08* (2006.01)
(52) U.S. Cl.
USPC ........................................................... 73/715
(58) Field of Classification Search
USPC ............................................. 73/715; 257/737
See application file for complete search history.

(56) References Cited

U.S. PATENT DOCUMENTS

| | | | |
|---|---|---|---|
| 6,028,358 A | 2/2000 | Suzuki | |
| 8,122,768 B2 * | 2/2012 | Yamamoto et al. | ............. 73/715 |
| 2005/0205950 A1 | 9/2005 | Kondo et al. | |

(Continued)

FOREIGN PATENT DOCUMENTS

| CN | 1983572 A | 6/2007 |
|---|---|---|
| DE | 102 38 523 A1 | 3/2004 |

(Continued)

OTHER PUBLICATIONS

S. Armbruster et al., "A Novel Micromachining Process for the Fabrication of Monocrystalline SI-Membranes Using Porous Silicon", Digest of Technical Papers Transducers, Mar. 2003, pp. 246-249.

(Continued)

*Primary Examiner* — Jewel V Thompson
(74) *Attorney, Agent, or Firm* — Westerman, Hattori, Daniels & Adrian, LLP

(57) ABSTRACT

A pressure sensor module includes a pressure sensor, a bump, and a laminated substrate. The pressure sensor includes a semiconductor substrate; a cavity; a pressure-sensitive element; and a conductive section. The cavity is disposed inside the semiconductor substrate such that a thin-plate region of the semiconductor substrate is provided and the thin-plate region being defined as a diaphragm. The pressure-sensitive element is arranged at the diaphragm. The conductive section is electrically connected to the pressure-sensitive element and disposed on the face of the semiconductor substrate at a region excluding the diaphragm. The bump is electrically connected to the conductive section. The laminated substrate includes a wiring base material electrically connected to the pressure sensor via the bump. The wiring base material is disposed inside the laminated substrate. A face of the wiring base material is electrically connected to the bump and has an exposed area from the laminated substrate.

4 Claims, 5 Drawing Sheets

(56) References Cited

U.S. PATENT DOCUMENTS

| | | |
|---|---|---|
| 2006/0151203 A1 | 7/2006 | Krueger et al. |
| 2007/0113661 A1 | 5/2007 | Benzel et al. |
| 2007/0176272 A1 | 8/2007 | Saitoh et al. |
| 2007/0275495 A1 | 11/2007 | Mayer et al. |
| 2008/0029852 A1 | 2/2008 | Murayama et al. |
| 2008/0128840 A1 | 6/2008 | Benzel |
| 2009/0266170 A1 | 10/2009 | Murashige et al. |

FOREIGN PATENT DOCUMENTS

| | | |
|---|---|---|
| DE | 10-2004-051468 A1 | 4/2006 |
| EP | 1826543 A2 | 8/2007 |
| JP | 1-273390 A | 11/1989 |
| JP | 11-326088 A | 11/1999 |
| JP | 2001-208628 A | 8/2001 |
| JP | 2002-090244 A | 3/2002 |
| JP | 2002-359340 A | 12/2002 |
| JP | 2007-71821 A | 3/2007 |
| JP | 2007-248212 A | 9/2007 |

OTHER PUBLICATIONS

European Search Report dated Mar. 22, 2011, issued in corresponding European Patent Application No. 09251157.5.

European Search Report dated Mar. 22, 2011, issued in corresponding European Patent Application No. 09251156.7.

Chinese Office Action mailed Feb. 29, 2012, issued in corresponding Chinese Patent Application No. 200910137358.8.

Office Action mailed on Jun. 5, 2012 in related Japanese Patent Application No. 2008-114263. English Translation.

Japanese Office Action mailed Dec. 4, 2012, issued in corresponding Japanese patent application No.2009-094079, w/English translation.

* cited by examiner

PRESSURE SENSOR MODULE AND ELECTRONIC COMPONENT

This application is a division of application Ser. No. 12/427,954 filed Apr. 22, 2009, which is hereby incorporated by reference in its entirety.

BACKGROUND OF THE INVENTION

1. Field of the Invention

The present invention relates to a pressure sensor module, and more particularly relates to a module structure that detects pressure in a diaphragm and has low fluctuation of pressure sensor characteristics, and a structure that can package the pressure sensor and application specific integrated circuit (ASIC) or another semiconductor device at high density and in a small size.

The present invention claims priority on Japanese Patent Application No. 2008-114262, filed on Apr. 24, 2008, and the contents of which are incorporated herein by reference.

2. Description of the Related Art

Pressure sensors are used in various fields such as household electric appliances, medical equipment, and vehicle parts. Semiconductor pressure sensors are increasingly being used, since they are small and highly reliable. Recently, with the aim of mounting pressure sensors in portable devices, there is a particular demand for a smaller package structure.

To realize a very small package, as disclosed in Japanese Unexamined Patent Application, First Publication No. 2007-248212, the applicant considered a surface mountable chip size package (CSP), and proposed a small pressure sensor module that can be realized by mounting a pressure sensor on a laminated substrate which an ASIC internally containing amplification and compensation circuits is buried in. FIG. 10 is a representative example of that structure. A pressure sensor 112 including a diaphragm 111 is mounted on a laminated substrate 115 in which an ASIC 114 is buried in via a bump 113. While this structure is suitable for realizing a small module in which a combination of devices such as the ASIC 114 and the pressure sensor 112 are mounted, some problems were discovered during subsequent systematic consideration.

In the conventional module structure shown in FIG. 10, since the pressure sensor 112 is mounted on a topmost face 115A of the laminated substrate 115, stress generated in the laminated substrate 115 is liable to be applied to the pressure sensor 112. Therefore, due to the stress applied from the laminated substrate 115 to the pressure sensor 112, there is some fluctuation in the output characteristics of the pressure sensor 112 before and after mounting it on the laminated substrate 115. This makes it difficult to obtain a pressure sensor module 130 having desired output characteristics.

SUMMARY OF THE INVENTION

The present invention has been realized in view of the above problems, and aims to provide a pressure sensor module in which fluctuation in the output characteristics of a pressure sensor due to stress generated in the laminated substrate is unlikely to occur, enabling the pressure sensor to achieve desired output characteristics.

A pressure sensor module according to a first aspect of the present invention includes a pressure sensor including: a semiconductor substrate; a cavity (space); a pressure-sensitive element; and a conductive section, wherein the cavity is disposed inside the semiconductor substrate and arranged substantially along a face of the semiconductor substrate at a substantially central area of the face such that a thin-plate region of the semiconductor substrate is provided at one side of the cavity, the thin-plate region being defined as a diaphragm, wherein the pressure-sensitive element is arranged at the diaphragm, wherein the conductive section is electrically connected to the pressure-sensitive element and is disposed on the face of the semiconductor substrate at a region excluding the diaphragm; a bump electrically connected to the conductive section; and a laminated substrate including a wiring base material electrically connected to the pressure sensor via the bump, wherein the wiring base material is disposed inside the laminated substrate, and a face of the wiring base material is electrically connected to the bump and has an exposed area from the laminated substrate.

A pressure sensor module according to a second aspect of the present invention is characterized in that, in the first aspect, the pressure sensor is surrounded by the laminated substrate such that at least a face of the semiconductor substrate is exposed.

A pressure sensor module according to a third aspect of the present invention is characterized in that, in the first aspect, the wiring base material is a semiconductor device.

An electronic component according to a fourth aspect of the present invention is characterized in that it includes the pressure sensor module of the first aspect.

According to the present invention, the wiring base material that is electrically connected to the pressure sensor is arranged within the laminated substrate, and the pressure sensor is mounted thereon. While stress generated in the laminated substrate is greatest at a topmost face of the laminated substrate, in this invention the wiring base material is arranged within the laminated substrate. Therefore, the stress applied to the pressure sensor can be reduced more than when it is mounted on a conventional pressure sensor module. Since this makes it possible to suppress the fluctuation in output characteristics of the pressure sensor before and after mounting due to the stress, and to provide a pressure sensor module with desired output characteristics.

The above and other aspects of the present invention will become apparent upon consideration of the following detailed descriptions of exemplary embodiments thereof, particularly when taken in conjunction with the accompanying drawings wherein like reference numerals in the various figures are utilized to designate like components.

DETAILED DESCRIPTION OF THE INVENTION

While the present invention will be explained in detail with reference to the drawings, these are not to be considered limitative of the invention, which can be modified in various ways without departing from its main features.

<First Embodiment>

Figure 1:
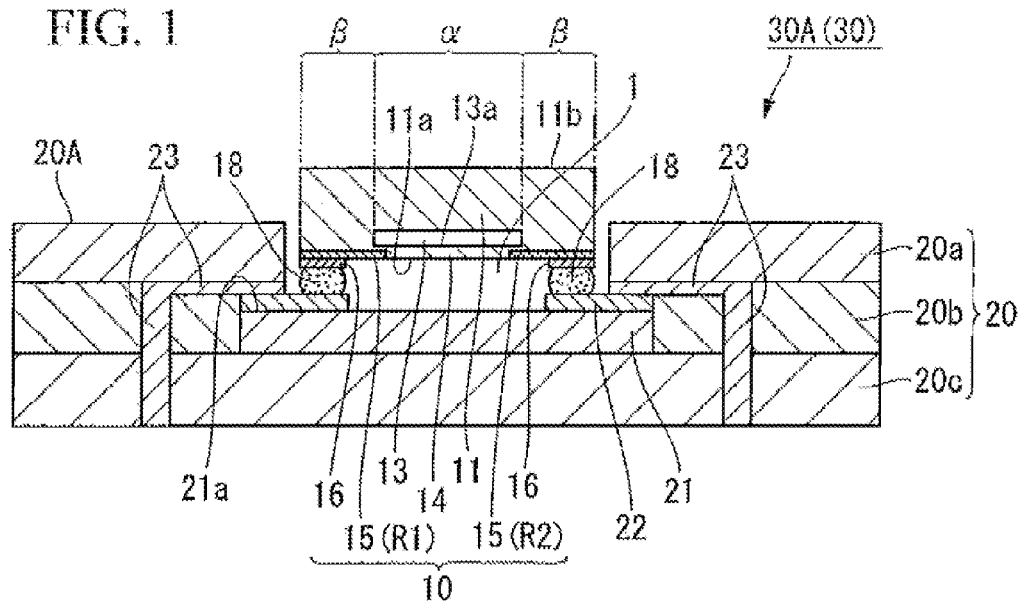
FIG. 1 is a schematic cross-sectional view showing one example of a pressure sensor module according to a first embodiment of the present invention.

FIG. 1 is a schematic cross-sectional view showing one example of a pressure sensor module according to a first embodiment of the present invention. In the embodiment, a pressure sensor module 30A mainly includes a pressure sensor 10, bumps 18, and a laminated substrate 20. In a face 11a of a semiconductor substrate 11, the pressure sensor 10 includes a cavity (gap portion) 13 that extends substantially parallel to the face 11a inside a central area "α" of the semiconductor substrate 11. A thin-plate region at a side 13a of the cavity 13 is defined as a diaphragm 14. Pressure-sensitive elements 15 are arranged in the diaphragm 14. The pressure sensor 11 includes conductive sections 16 that are electrically connected to the pressure-sensitive elements 15, wherein the conductive sections 16 are arranged in a region excluding the diaphragm 14 on the face 11a. The bump 18 is arranged in each conductive section 16 respectively, and is electrically connected to the conductive section 16 separately. The laminated substrate 20 includes a wiring base material 21 that is electrically connected to the pressure sensor 10 via the bumps 18. Further, the wiring base material 21 is arranged inside the laminated substrate 20. At least one part of a face 21a of the wiring base material 21 that is electrically connected to the bumps 18 is exposed from the laminated substrate 20. Each of these constituent parts will be explained in detail below.

The semiconductor substrate 11 can be made from, for example, a silicon wafer or such like. In this embodiment, the face 11a of the semiconductor substrate 11 where the diaphragm 14 is formed is arranged opposite the face 21a of the wiring base material 21.

The cavity 13 is a space formed inside the semiconductor substrate 11 and adjacent to the face 11a of the semiconductor substrate 11. In this embodiment, the cavity 13 is an airtight space in the semiconductor substrate 11 to which a face of the diaphragm 14 faces. The size of the cavity 13 can be set appropriately such that the diaphragm 14 has a desired thickness.

There are no limitations on the shape of the diaphragm 14, which need only obtain a direct proportional relationship between pressure and static capacitance within the load pressure range of the measured target, and can be any shape such as rectangular, square, circular; in this example it is rectangular.

Figure 2:
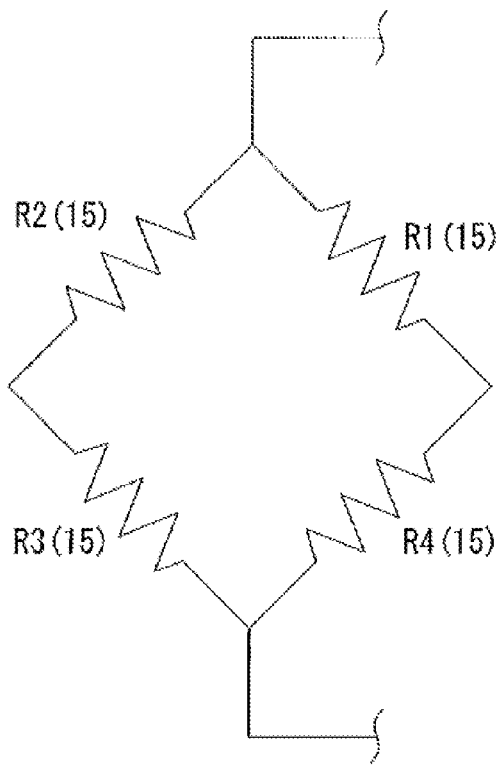
FIG. 2 is an electrical wiring view showing one example of a pressure-sensitive element.

The pressure-sensitive elements 15 are gauge resistances (R1 to R4) arranged in a peripheral portion of the diaphragm 14, their output signals varying in accordance with the amount of bending of the diaphragm 14, and pressure thereby being detected. FIG. 2 is an electrical wiring view showing the pressure-sensitive elements 15.

As shown in FIG. 2, these gauge resistances (R1 to R4) are electrically connected by lead wires (not shown) to form a Wheatstone bridge. Since forces of compression and elongation in the peripheral portion of the diaphragm 14 are easily applied to the pressure-sensitive elements 15, a highly sensitive pressure sensor 10 can be obtained.

In this embodiment, the pressure-sensitive elements 15 is arranged near the diaphragm 14 and buried in the semiconductor substrate 11 at the face 11a. Alternatively, they can be arranged at any location that enables them to detect bending of the diaphragm 14, e.g. they can protrude from the face 11a of the semiconductor substrate 11.

The conductive sections 16 are made by fabricating a thin film of any type of metal that is generally used as material for electrode, such as Al, Cr, Au, Ag, Cu, and Ti, on the face 11a of the semiconductor substrate 11 using a method such as vaporization, sputtering, non-electrolytic plating, etc.

The pattern of the conducive sections 16 can be patterned by using a mask to cover portions of the face 11a of the semiconductor substrate 11 where the conductive sections will not be fabricated and forming a metal film only in portions where the conductive sections will be fabricated, or by forming a uniform metal film on the face 11a of the semiconductor substrate 11 and then performing photolithography to etch this metal film to a desired pattern.

There are no particular limitations on the bumps 18, which need only be capable of electrically connecting the pressure sensor 10 to the wiring base material 21 arranged in the laminated substrate 20. When the pressure sensor 10 and the laminated substrate 20 are electrically connected via the bumps 18, a gap (interval) 1 is formed between the face 21a of the wiring base material 21 and the face 11a of the semiconductor substrate 11. Due to the formation of the gap 1, the pressure sensor 10 is not directly subjected to stress from the laminated substrate 20, enabling that stress to be alleviated.

The laminated substrate 20 is configured by superimposing, for example, three substrates 20a, 20b, and 20c, as shown in FIG. 1. In this embodiment, the laminated substrate 20 need only have two or more substrates composed of the same or different materials, there being no particular limitation on the number of substrates that are superimposed. In this embodiment, three substrates are superimposed. Alternatively, two substrates are acceptable, as is a laminated substrate formed by superimposing a plurality of substrates.

There are no particular limitations on the substrates that constitute the laminated substrate 20, and conventional substrates can be used, such as a flexible printed circuit board with a polyimide base, etc.

A wiring base material 21 is arranged on the laminated substrate 20, and is electrically connected to the pressure sensor 10. A wiring portion 23 is also arranged on the laminated substrate 20, and is electrically connected to the wiring base material 21.

The wiring portion 23 connects a pressure signal from the pressure sensor 10 outputted from the conductive sections 16 or the wiring base material 21 to, for example, an amplification circuit or a temperature compensation circuit fabricated on the laminated substrate 20. There are no particular limitations on the wiring portion 23, which can be made from a metal that is generally used as material for electrode, such as Al, Cr, Au, Ag, Cu, and Ti.

The wiring base material 21 is arranged on the laminated substrate 20 and the pressure sensor 10 is mounted on it.

By arranging the wiring base material 21 within the laminated substrate 20, and mounting the pressure sensor 10 so that the diaphragm 14 is opposite the wiring base material 21, mechanical stress from the outside can be prevented from acting on and damaging sections that are vulnerable to damage, such as the joined portions between the diaphragm 14 and the bumps 18.

Conductors 22 are arranged on the wiring base material 21, and electrically connect to the conductive sections 16 of the pressure sensor 10. There are no particular limitations on the conductors 22, which can be made from any metal that is generally used as material for electrode, such as Al, Cr, Au, Ag, Cu, and Ti, this metal being selected with due consideration for its compatibility with the wiring base material 21 and the bumps 18.

According to this embodiment, the wiring base material 21 that is electrically connected to the pressure sensor 10 is arranged within the laminated substrate 20, and the pressure sensor 10 is mounted thereon. Since stress generated in the laminated substrate 20 is greatest at the topmost face 20A of the laminated substrate 20, the stress applied to the pressure sensor 10 can be reduced more than when it is mounted on a conventional pressure sensor module.

Also, rather than mounting the pressure sensor 10 directly on the laminated substrate 20, it is arranged at an gap from side faces of the laminated substrate 20 and the face 21a of the laminated substrate 20. Stress generated in the laminated substrate 20 and applied to the pressure sensor 10 is thus alleviated, and fluctuation in output characteristics of the pressure sensor 10 before and after mounting caused by this stress can be suppressed, whereby a pressure sensor module 30A with desired output characteristics can be provided.

In particular, this invention can be configured simply by arranging the wiring base material 21 within a conventional laminated substrate, and mounting the pressure sensor 10 on the wiring base material 21. This makes it easy to provide a pressure sensor module 30A which is unlikely to have fluctuating output characteristics.

Since the wiring base material 21 is arranged within the laminated substrate 20, the pressure sensor module 30A which the pressure sensor 10 is mounted in can be made thinner, and mechanical stress from the outside can be prevented from acting on and damaging sections that are vulnerable to damage, such as the joined portions between the diaphragm 14 and the bumps 18.

<Second Embodiment>

Figure 3:
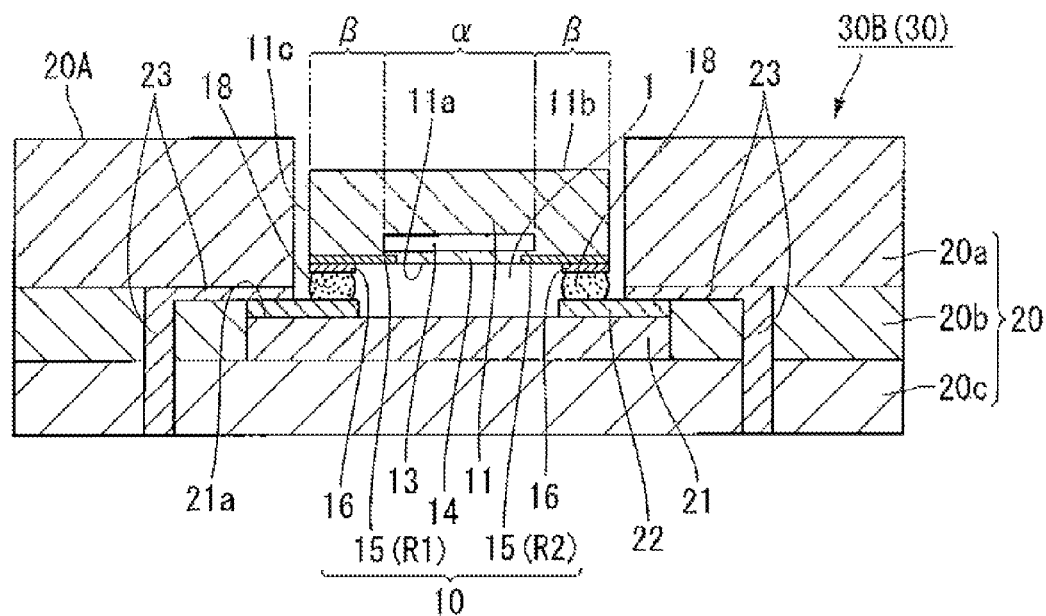
FIG. 3 is a schematic cross-sectional view showing one example of a pressure sensor module according to a second embodiment of the present invention.

FIG. 3 is a schematic cross-sectional view showing one example of a pressure sensor module 30B according to a second embodiment of the present invention. Like parts to those in the first embodiment are designated with like reference codes, and are not repetitiously explained.

In this embodiment, in the face that the pressure sensor 10 is mounted on, the topmost face 20A of the laminated substrate 20 is at the same position as the top face of the pressure sensor 10 (other face 11b of the semiconductor substrate 11) or higher than that. Consequently, side faces 11c of the semiconductor substrate 11 are enclosed by the laminated substrate 20a, and, in the completed pressure sensor module 30B, direct outside force against the pressure sensor 10 is considerably suppressed.

Therefore, in addition to the effects of the first embodiment described above, direct outside force against the pressure sensor 10 can be considerably suppressed both during delivery and after mounting it on a product, and dramatic reductions can be achieved in stress applied during delivery affects the diaphragm 14, change in the output characteristics of the pressure sensor 10, detachment of the pressure sensor 10 from the laminated substrate 20 after being mounting on the product, or problems arising from breakage in electrical connection and damage to the diaphragm 14.

<Third Embodiment>

Figure 4:
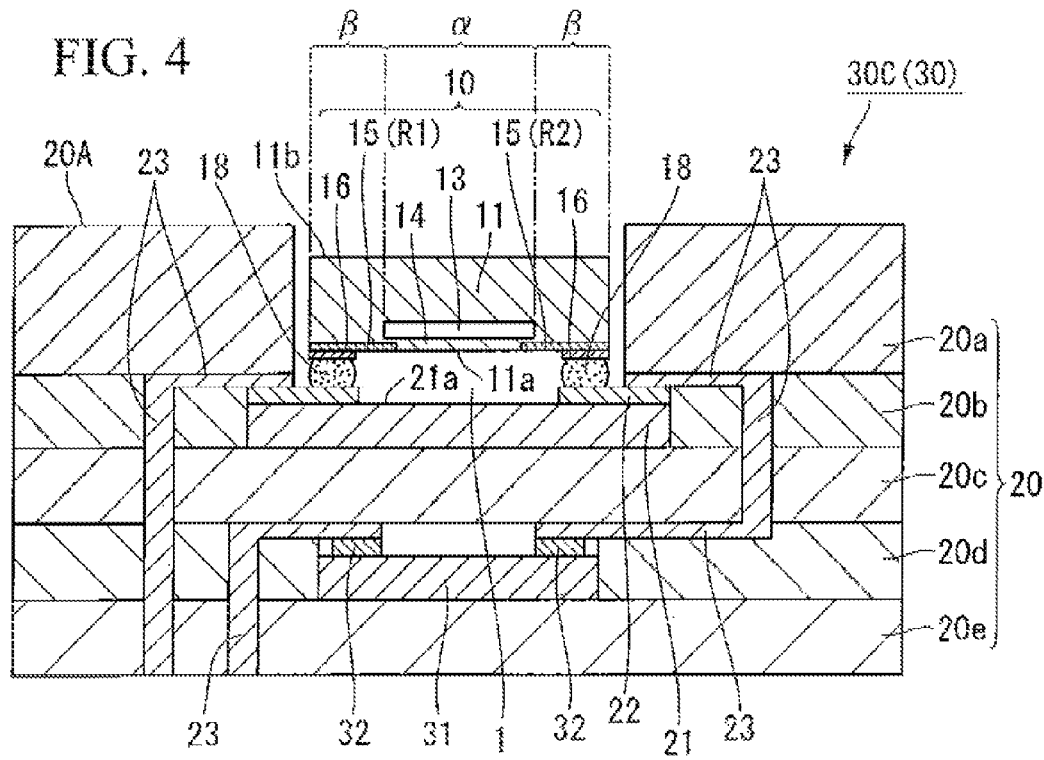
FIG. 4 is a schematic cross-sectional view showing one example of a pressure sensor module according to a third embodiment of the present invention.

FIG. 4 is a schematic cross-sectional view showing one example of a pressure sensor module 30C according to a third embodiment of the present invention. In this embodiment, the pressure sensor module 30C differs from the pressure sensor module 30A of the first embodiment in that a semiconductor device 31 is arranged within the laminated substrate 20, and electrically connected to the pressure sensor 10. Like parts to those in the first embodiment are designated with like reference codes, and are not repetitiously explained.

There are no particular limitations on the semiconductor device 31, which can include, for example, an application specific integrated circuit (ASIC) that performs sensitive amplification, temperature compensation, etc. for the pressure sensor 10.

According to the pressure sensor module 30C of the third embodiment, the semiconductor device (e.g. ASIC) 31 that controls the pressure sensor 10 is provided within the laminated substrate 20, thereby eliminating the need for an external control circuit or such like to control the pressure sensor 10. Therefore, in addition to the effects obtained by the first embodiment, this embodiment can provide the pressure sensor 10 and a semiconductor device 31 such as a control circuit for the pressure sensor 10 together in one package. Thereby the pressure sensor module 30C that is small and thin can be obtained. Moreover, by burying a variety of semiconductor devices 31 in the laminated substrate 20, a highly functional, high-density pressure sensor package can be provided.

In this embodiment, as in the second embodiment, the topmost face 20A of the laminated substrate 20 can be exposed so that it is at the same position as the other face 11b of the semiconductor substrate 11, or higher than that, the pressure sensor 10 being covered with (surrounded by) the laminated substrate 20. This obtains the same effects as those of the second embodiment.

<Fourth Embodiment>

Figure 5:
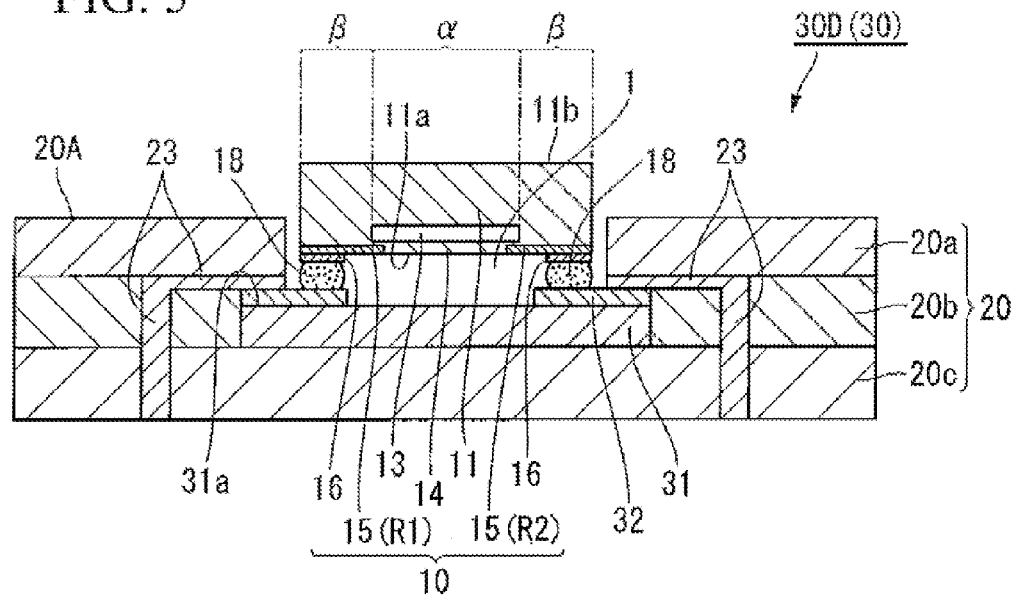
FIG. 5 is a schematic cross-sectional view showing one example of a pressure sensor module according to a fourth embodiment of the present invention.

FIG. 5 is a schematic cross-sectional view showing one example of a pressure sensor module 30D according to a fourth embodiment of the present invention. In this invention, the pressure sensor module 30D differs from the pressure sensor module 30A of the first embodiment in that a semiconductor device 31 is used as a wiring base material 21 arranged within the laminated substrate 20.

In the semiconductor device 31, an electrical circuit 32 is formed on a face 31a where the pressure sensor 10 is mounted, a portion of this circuit 32 is electrically connected to the bumps 18, and the semiconductor device 31 is electrically connected to the pressure sensor 10. This enables signals to be exchanged between the pressure sensor 10 and the semiconductor device 31.

In this embodiment, by using the semiconductor device 31 as the wiring base material 21, in addition to the effects of the first and the third embodiments mentioned above, a pressure sensor module 30D that is smaller and thinner than the pressure sensor module 30C of the third embodiment can be obtained.

In this embodiment, as in the second embodiment, the topmost face 20A of the laminated substrate 20 can be exposed so that it is at the same position as the other face 11b of the semiconductor substrate 11, or higher than that, the pressure sensor 10 being covered with the laminated substrate 20. The same effects as those of the second embodiment can be obtained.

<Fifth Embodiment>

Figure 6:
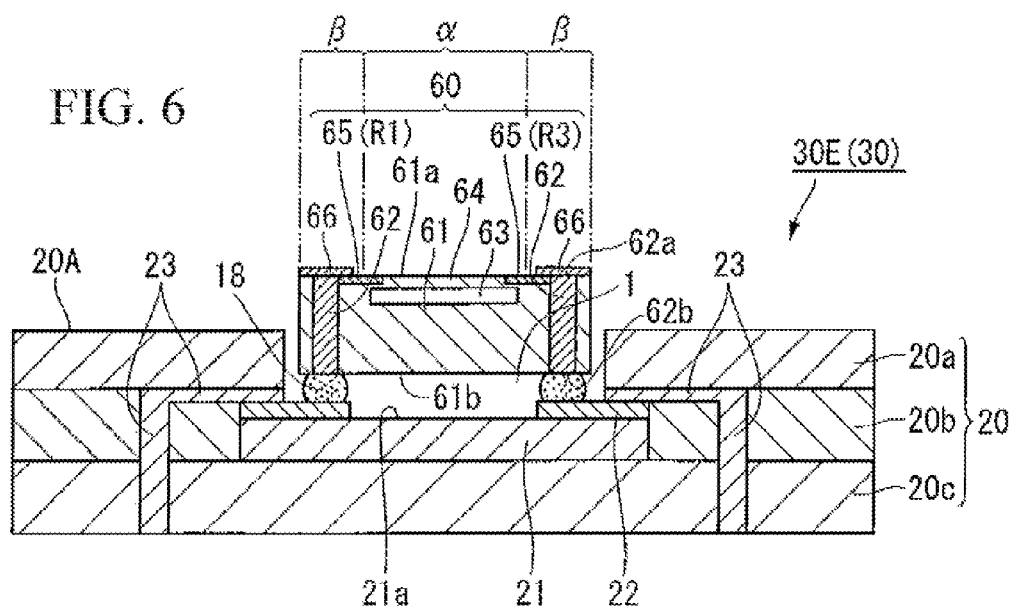
FIG. 6 is a schematic cross-sectional view showing one example of a pressure sensor module according to a fifth embodiment of the present invention.

FIG. 6 is a schematic cross-sectional view showing one example of a pressure sensor module 30E according to a fifth embodiment of the present invention. In this embodiment, the pressure sensor module 30E mainly includes a pressure sensor 60, bumps 18, and a laminated substrate 20. In a face 61a of a semiconductor substrate 61, the pressure sensor 60 includes a cavity 63 that extends substantially parallel to the face 61a inside a central area "α" of the semiconductor substrate 61. A thin-plate region at a side of the cavity 63 is defined as a diaphragm 64. Pressure-sensitive elements 65 are arranged in the diaphragm 64. The pressure sensor 60 also includes conductive sections 66 that are electrically connected to the pressure-sensitive elements 65 and are arranged in a region excluding the diaphragm 64 on the face 61a. The bump 18 is arranged in each conductive section 66 respectively, and is electrically connected to the conductive sections 66 separately. The laminated substrate 20 includes a wiring base material 21 that is electrically connected to the pressure sensor 60 via the bumps 18.

Further, the wiring base material 21 is arranged inside the laminated substrate 20, and at least one part of a face 21a of the wiring base material 21 that is electrically connected to the bumps 18 is exposed from the laminated substrate 20.

In this embodiment, the pressure sensor module 30E differs from the pressure sensor module 30A of the first embodiment in regard to three points, firstly, that through-hole electrodes 62 are provided in the pressure sensor 60, so that one end 62a of the through-hole electrode 62 is electrically connected to the conductive section 66 and another end 62b of the through-hole electrode 62 is exposed on other face 61b of the semiconductor substrate 61, secondly, that the through-hole electrodes 62 are electrically connected to the wiring base material 21 via the bumps 18, and thirdly, that the diaphragm 64 is arranged on the face 61a on the reverse of the semiconductor substrate 61 with respect to the face 61b opposite the laminated substrate 20.

The semiconductor substrate 61, the cavity 63, the diaphragm 64, the pressure-sensitive elements 65, and the conductive sections 66 are respectively similar to the semiconductor substrate 11, the cavity 13, the diaphragm 14, the pressure-sensitive elements 15, and the conductive sections 16 of the first embodiment.

There are no particular limitations on the through-hole electrodes 62, conventional electrodes can be used; and which can be formed by, for example, a through-hole in the semiconductor substrate 61 can be filled with gold, another metal material, or a solder alloy, etc.

According to this embodiment, the wiring base material 21 that is electrically connected to the pressure sensor 60 is arranged in the laminated substrate 20 and the pressure sensor 60 is mounted on it. Since stress generated in the laminated substrate 20 is greatest at the topmost face 20A of the laminated substrate 20, the stress applied to the pressure sensor 60 can be reduced more than when it is mounted on a conventional pressure sensor module. Also, rather than mounting the pressure sensor 60 directly on the laminated substrate 20, it is arranged at an gap from side faces of the laminated substrate 20 and the face 21a of the laminated substrate 20.

The fluctuation in output characteristics of the pressure sensor 60 before and after mounting caused by the stress can be suppressed, whereby a pressure sensor module 30E with desired output characteristics can be provided.

In particular, this invention can be configured simply by arranging the wiring base material 21 within a conventional laminated substrate, and mounting the pressure sensor 60 on the wiring base material 21. This makes it easy to provide a pressure sensor module 30E whose output characteristics are unlikely to fluctuate.

Since the wiring base material 21 is arranged within the laminated substrate 20, the pressure sensor module 30E which the pressure sensor 60 is mounted on can be made thinner, and mechanical stress from the outside can be prevented from acting on and damaging sections that are vulnerable to damage, such as the joined portions between the diaphragm 14 and the bumps 18.

<Sixth Embodiment>

Figure 7:
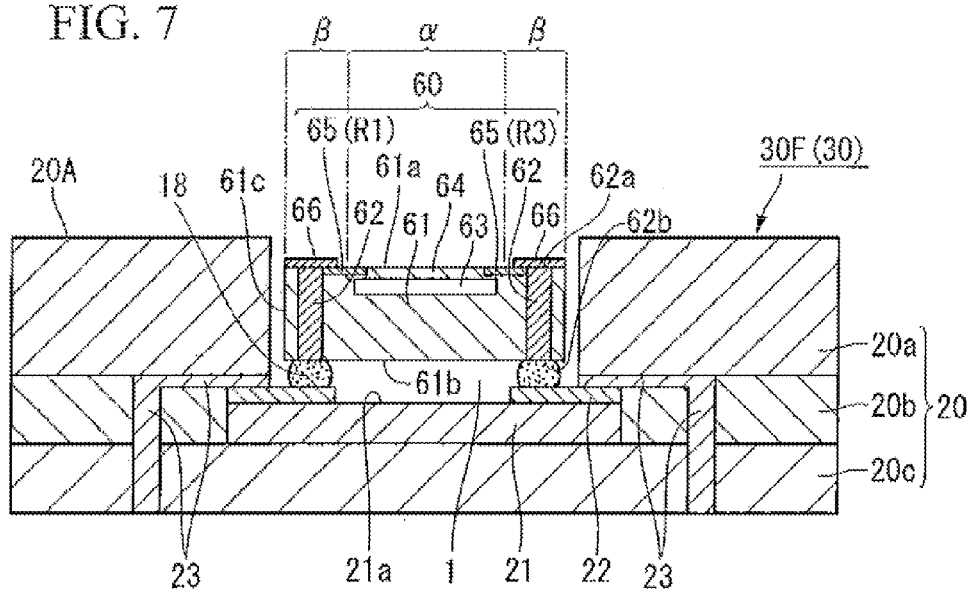
FIG. 7 is a schematic cross-sectional view showing one example of a pressure sensor module according to a sixth embodiment of the present invention.

FIG. 7 is a schematic cross-sectional view showing one example of a pressure sensor module 30F according to a sixth embodiment of the present invention. Like parts to those in the first and fifth embodiments are designated with like reference codes, and are not repetitiously explained.

In this embodiment, at the face that the pressure sensor 60 is mounted on, the topmost face 20A of the laminated substrate 20 is at the same position as the top face of the pressure sensor 60 (a face 61a of the semiconductor substrate 61) or higher than that. Side faces 61c of the semiconductor substrate 61 are thus enclosed by the laminated substrate 20a, and, in the completed pressure sensor module 30F, direct outside force applied to the pressure sensor 60 is considerably suppressed.

Therefore, in addition to the effects of the fifth embodiment described above, direct outside force against the pressure sensor 60 can be considerably suppressed both during delivery and after mounting it on a product, and dramatic reductions can be achieved in the effects of stress applied during delivery on the diaphragm 64 and leading to change in the output characteristics of the pressure sensor 60, detachment of the pressure sensor 60 from the laminated substrate 20 after being mounting on the product, or problems arising from breakage in electrical connection and damage to the diaphragm 64.

<Seventh Embodiment>

Figure 8:
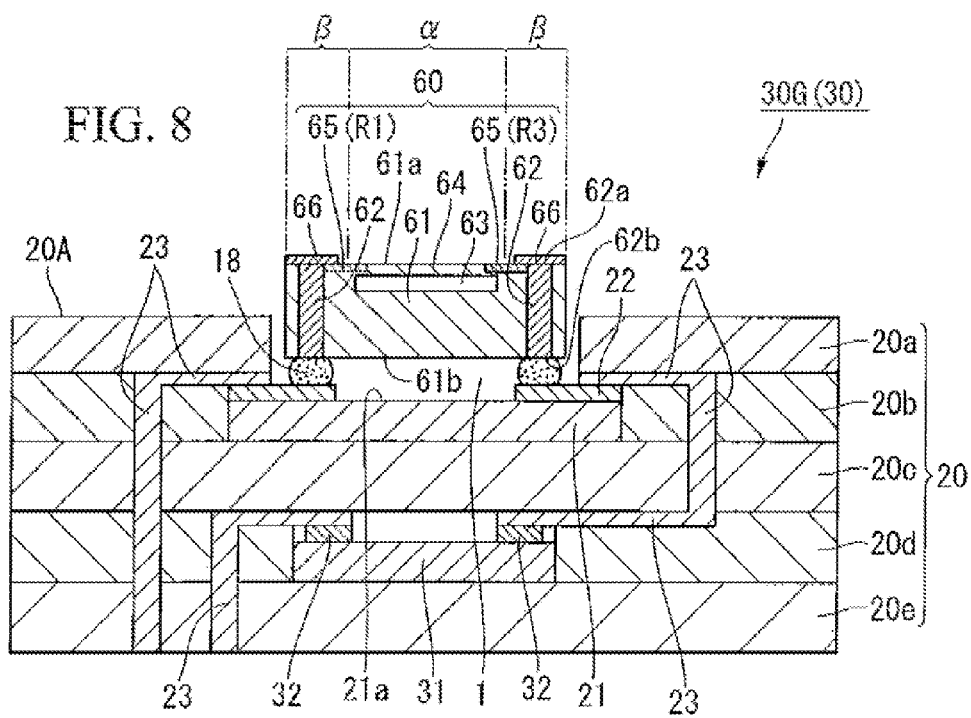
FIG. 8 is a schematic cross-sectional view showing one example of a pressure sensor module according to a seventh embodiment of the present invention.

FIG. 8 is a schematic cross-sectional view showing one example of a pressure sensor module 30G according to a seventh embodiment of the present invention. In this embodiment, the pressure sensor module 30G differs from the pressure sensor module 30E of the fifth embodiment in that a semiconductor device 31 is additionally arranged within the laminated substrate 20.

There are no particular limitations on the semiconductor device 31, which can include, for example, an application specific integrated circuit (ASIC) for performing sensitive amplification, temperature compensation, etc. for pressure sensor 60.

According to the pressure sensor module 30G of this embodiment, as in the pressure sensor module 30B of the second embodiment, the semiconductor device (e.g. ASIC) 31 for controlling the pressure sensor 60 is provided within the laminated substrate 20, thereby eliminating the need for an external control circuit or such like to control the pressure sensor 60.

Therefore, in addition to the effects obtained in the fifth embodiment, this embodiment can provide the pressure sensor 60 and the semiconductor device 31 such as a control circuit for the pressure sensor 60 together in one package, and thereby the pressure sensor module 30G that is small and thin can be obtained. Moreover, by burying various semiconductor devices 31 in the laminated substrate 20, a highly functional, high-density pressure sensor package can be provided.

Incidentally, in this embodiment, as in the sixth embodiment, the topmost face 20A of the laminated substrate 20 can be exposed so that it is at the same position as the face 61a of the semiconductor substrate 61, or higher than that, the pressure sensor 60 being covered with the laminated substrate 20. The same effects as those of the sixth embodiment can be obtained.

<Eighth Embodiment>

Figure 9:
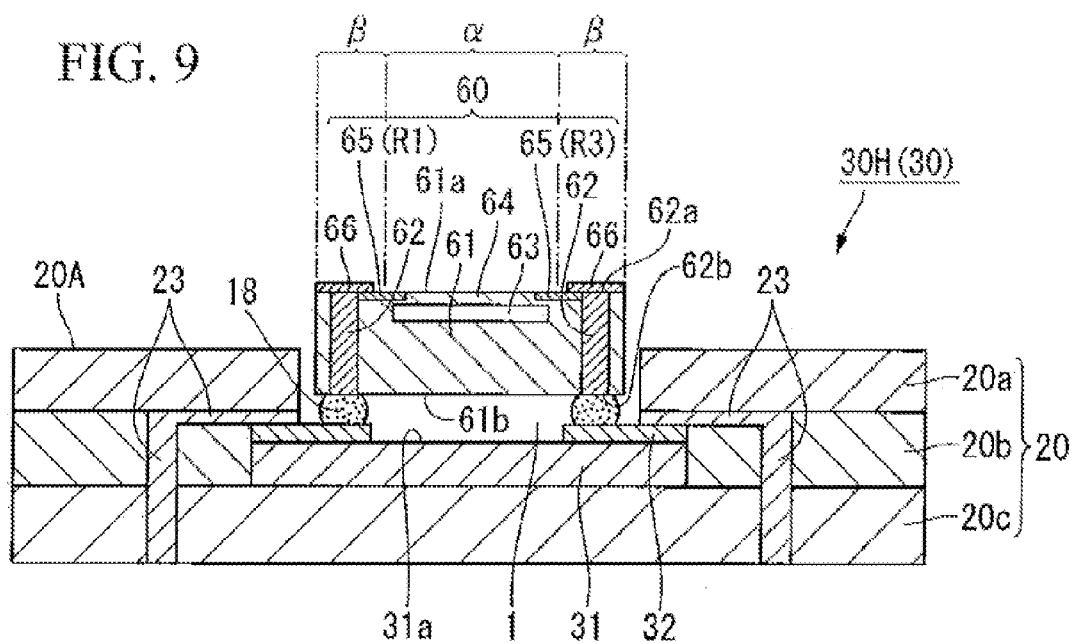
FIG. 9 is a schematic cross-sectional view showing one example of a pressure sensor module according to a eighth embodiment of the present invention.
Figure 10:
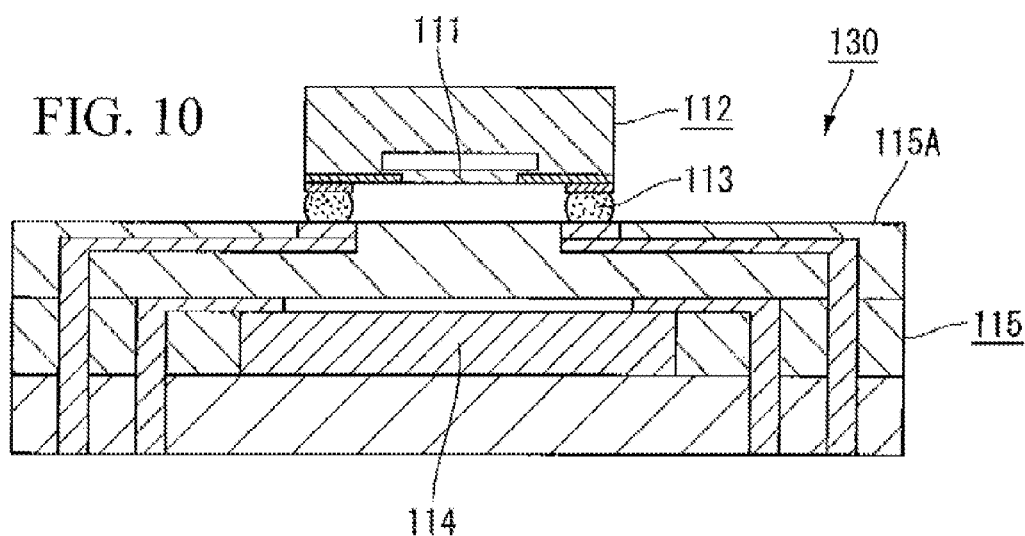
FIG. 10 is a schematic cross-sectional view showing a conventional pressure sensor module.

FIG. 9 is a schematic cross-sectional view showing one example of a pressure sensor module 30H according to an eighth embodiment of the present invention. In this embodiment, the pressure sensor module 30H differs from the pressure sensor module 30E of the fifth embodiment in that a semiconductor device 31 is used as a wiring base material 21 arranged within the laminated substrate 20.

In the semiconductor device 31, an electrical circuit 32 is formed on a face 31a where the pressure sensor 60 is mounted, a portion of this circuit 32 is electrically connected to the bumps 18, and the semiconductor device 31 is electrically connected to the pressure sensor 60. Signals can thus be exchanged between the pressure sensor 60 and the semiconductor device 31.

In this embodiment, by using the semiconductor device 31 as the wiring base material 21, in addition to the effects of the fifth and seventh embodiments mentioned above, it is possible to obtain a pressure sensor module 30H that is smaller and thinner than the pressure sensor module 30G of the seventh embodiment.

In this embodiment, as in the sixth embodiment, the topmost face 20A of the laminated substrate 20 can be exposed so that it is at the same position as the face 61a of the semiconductor substrate 61, or higher than that, the pressure sensor 60 being covered with the laminated substrate 20. The same effects as the sixth embodiment can be obtained.

In the pressure sensor module 30 according to the first to the eighth embodiments described above, the coefficients of thermal expansion (CTE) of the wiring base material 21 is preferably approximately the same as that of the semiconductor substrates 11 and 61 of the pressure sensors 10 and 60.

When a pressure sensor is attached by direct reflow on a laminated substrate in the conventional manner at a certain temperature (usually around 260° C.), due to the difference of the CTE between the sensor and the substrate, at the usage temperature of the pressure sensor (e.g. room temperature), there is residual stress near the soldered bump. Consequently, stress on the diaphragm changes before and after mounting the pressure sensor, whose output characteristics change as a result.

Due to the difference of CTE between the pressure sensor and the laminated substrate, residual stress changes (creep) over time, whereby the characteristics of the sensor also fluctuate over time. When thermal fluctuation is added to this, the sensor and the substrate expand and contract in accordance with their CTE, resulting in poor thermal reliability.

If the CTE of the wiring base material 21 is approximately the same as that of the semiconductor substrates 11 and 61 of the pressure sensors 10 and 60, stress caused by difference in their CTE can be suppressed. It is also possible to minimize residual stress after the pressure sensors 10 and 60 are attached by direct reflow to the laminated substrate 20, and fluctuation (creep) in this stress over time.

This makes it possible to reduce fluctuation in the output characteristics of the pressure sensors 10 and 60 before and after mounting, to maintain desired output characteristics, and to dramatically increase reliability of the temperature cycle and the like.

The wiring base material 21 can be modified as appropriate in accordance with the semiconductor substrates 11 and 61 used in the pressure sensors 10 and 60. For example, it can be made from silicon, ceramic, glass, etc.

Incidentally, when using the semiconductor device 31 as the wiring base material 21, the CTE of the wiring base material 21 is preferably approximately the same as that of the semiconductor substrates 11 and 61 of the pressure sensors 10 and 60. As with the wiring base material 21 described earlier, this makes it possible to suppress stress caused by difference in the CTE, and to minimize residual stress after the pressure sensors 10 and 60 are attached by direct reflow on the laminated substrate 20 and fluctuation (creep) in this stress over time.

This makes it possible to obtain a pressure sensor module which can reduce fluctuation in the output characteristics of the pressure sensors 10 and 60 before and after mounting, can maintain desired output characteristics, and can dramatically increase the reliability of the temperature cycle and the like.

The semiconductor device 31 can be modified as appropriate in accordance with the semiconductor substrates 11 and 61 used in the pressure sensors 10 and 60. For example, it can be made from silicon, ceramic, glass, etc.

An electronic component of the present invention includes the pressure sensor module 30 described in any one of the first to the eighth embodiments described above. Therefore, since the electronic component is hardly affected by stress from the outside or inside, it becomes possible to provide an electronic component that can detect pressure with high precision and superior reproducibility.

Since the invention can provide a pressure sensor module that alleviates stress applied to a pressure sensor and maintains desired output characteristics, it is ideally applicable to various electronic components which are used, for example, in measuring pressure such as air pressure, water pressure, and oil pressure, and which can measure with high precision and superior reproducibility.

While the invention has been particularly shown and described with reference to exemplary embodiments thereof, the invention is not limited to the exemplary embodiments. It will be understood by those of ordinary skill in the art that various changes in form and details may be made therein without departing from the scope of the invention as defined by the following claims.

What is claimed is:

1. A pressure sensor module comprising:
a pressure sensor;
the pressure sensor comprising: a semiconductor substrate; a cavity; a pressure-sensitive element; and a conductive section,
wherein the cavity is disposed inside the semiconductor substrate and arranged substantially along a face of the semiconductor substrate at a substantially central area of the face such that a thin-plate region of the semiconductor substrate is provided at one side of the cavity, the thin-plate region being defined as a diaphragm,
wherein the pressure-sensitive element is arranged at the diaphragm,
wherein the conductive section is electrically connected to the pressure-sensitive element and is disposed on the face of the semiconductor substrate at a region excluding the diaphragm; and
a laminated substrate including a wiring base material on which the pressure sensor is mounted,
wherein a face of the wiring base material on which the pressure sensor is mounted is disposed inside the laminated substrate such that the face of the wiring base material has an exposed area from the laminated substrate.

2. The pressure sensor module according to claim 1, wherein the pressure sensor is surrounded by the laminated substrate such that at least a face of the semiconductor substrate is exposed.

3. The pressure sensor module according to claim 1, wherein the wiring base material is a semiconductor device.

4. An electronic component comprising the pressure sensor module according to claim 1.

\* \* \* \* \*